United States Patent
Kim

(10) Patent No.: US 8,787,104 B2
(45) Date of Patent: Jul. 22, 2014

(54) SEMICONDUCTOR MEMORY DEVICE

(75) Inventor: Keun Kook Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 308 days.

(21) Appl. No.: 13/243,245

(22) Filed: Sep. 23, 2011

(65) Prior Publication Data
US 2012/0170396 A1    Jul. 5, 2012

(30) Foreign Application Priority Data

Dec. 29, 2010  (KR) .......................... 10-2010-0137933

(51) Int. Cl.
*G11C 7/00*    (2006.01)

(52) U.S. Cl.
USPC ............................. 365/222; 365/211; 365/236

(58) Field of Classification Search
USPC ......................................... 365/222, 211, 236
See application file for complete search history.

(56) References Cited

U.S. PATENT DOCUMENTS 4,716,551 A * 12/1987 Inagaki .......................... 365/222
8,325,550 B2 * 12/2012 Teramoto ...................... 365/222

FOREIGN PATENT DOCUMENTS

| KR | 1020060010952 A | 3/2006 |
| KR | 1020070085662 A | 8/2007 |
| KR | 1020090016522 A | 2/2009 |
| KR | 1020100103147 A | 9/2010 |

* cited by examiner

*Primary Examiner* — Son Dinh
*Assistant Examiner* — Nam Nguyen
(74) *Attorney, Agent, or Firm* — William Park & Associates Patent Ltd.

(57) ABSTRACT

A semiconductor memory device includes a temperature sensor configured to generate a low-temperature signal which is enabled at below first set temperature and a high-temperature signal which is enabled at above second set temperature; a start signal generator configured to receive a refresh command and generate a start signal according to the low-temperature signal; and an address counter configured to count refresh addresses in response to the start signal.

5 Claims, 3 Drawing Sheets

SEMICONDUCTOR MEMORY DEVICE

CROSS-REFERENCES TO RELATED APPLICATIONS

The present application claims priority under 35 U.S.C. 119(a) to Korean Application No. 10-2010-0137933, filed on Dec. 29, 2010, in the Korean Intellectual Property Office, which is incorporated herein by reference in its entirety set forth in full.

BACKGROUND

With broadening uses of mobile products such as a mobile phone and a personal digital assistant (PDA), various attempts to reduce the current consumption of a semiconductor memory device mounted on such mobile products have been continuously made. In particular, reducing a refresh current of a semiconductor memory device for mobile products is becoming a big issue.

The Dynamic Random Access Memory (DRAM) has such a characteristic that information stored in memory cells eventually fade unless the capacitors of the memory cells are recharged periodically, and the recharging operation is referred to as refresh operation. The refresh operation is performed as follows: a word line is activated at least one time within a data retention time of the memory cell in order to sense and amplify the data. Here, the data retention time refers to a time during which data can be retained in a cell without refresh, after the data is written in the cell.

The refresh operation includes auto-refresh operation which is performed during a normal operation and self-refresh operation which is performed in a power down mode or the like. Here, the self-refresh operation is performed by a self-refresh signal which is generated by a command decoder receiving a command signal. That is, when a self-refresh signal is enabled for self-refresh operation, a periodic signal generated by a self-refresh oscillator is outputted according to a self-refresh period.

FIG. 1 is a block diagram illustrating the configuration of a known semiconductor memory device performing refresh.

Referring to FIG. 1, the known semiconductor memory device includes an address counter 11 and a row decoder 12. The address counter 11 is configured to receive a start signal CNT which is enabled when an auto-refresh command or self-refresh command is inputted, and count refresh addresses RAT<1:N>. The row decoder 12 is configured to decode the refresh addresses RAT<1:N> and generate row addresses $XADD<1:2^N>$ for refreshing a memory cell array 13.

According to an example, the refresh of the semiconductor memory device configured in such a manner generates $2^N$ row addresses $XADD<1:2^N>$ whenever an auto-refresh command or self-refresh command is inputted. Therefore, if the memory cell array 13 includes $4*2^N$ memory cells, four memory cells may be simultaneously refreshed whenever the address counter 11 counts the refresh address RAT<1:N>.

However, refresh frequency needs to be controlled depending on the temperature. That is, at low temperature where the data retention time increases, the refresh frequency may be decreased to reduce current consumption, and at high temperature where the retention time decreases, the refresh frequency may be increased to reduce a probability of a refresh fail. However, the refresh of the known semiconductor memory device perform the refresh operation constantly regardless of the temperature change, e.g., generates $2^N$ row addresses $XADD<1:2^N>$ whenever an auto-refresh command or self-refresh command is inputted.

SUMMARY

An embodiment of the present invention relates to a semiconductor memory device capable of controlling refresh operation depending on the temperature.

In an embodiment, a semiconductor memory device includes: a temperature sensor configured to generate a low-temperature signal which is enabled at below first set temperature and a high-temperature signal which is enabled at above second set temperature; a start signal generator configured to receive a refresh command and generate a start signal according to the low-temperature signal; and an address counter configured to count refresh addresses in response to the start signal. The number of refresh addresses counted by the address counter is determined according to the low-temperature signal and the high-temperature signal.

In an embodiment, a semiconductor memory device includes: a temperature sensor configured to generate a low-temperature signal which is enabled at below set temperature; a start signal generator configured to generate a start signal which is enabled after at least two refresh commands are inputted if the low-temperature signal is enabled; an address counter configured to count refresh addresses in response to the start signal; and a row decoder configured to decode the refresh addresses and generate row addresses for refreshing memory cells included in a memory cell array.

In an embodiment, a semiconductor memory device includes: a temperature sensor configured to generate a low-temperature signal which is enabled at below set temperature; an address counter configured to count a larger number of refresh addresses when the low-temperature signal is enabled than when the low-temperature signal is disabled; and a row decoder configured to decode the refresh addresses and generate row addresses for refreshing memory cells included in a memory cell array.

In an embodiment, a semiconductor memory device includes: a temperature sensor configured to generate a low-temperature signal which is enabled at below set temperature; a start signal generator configured to generate a start signal which is enabled when the low-temperature signal is enabled and at least two refresh commands are inputted; an address counter configured to count a larger number of refresh addresses when the low-temperature signal is enabled than when the low-temperature signal is disabled; and a row decoder configured to decode the refresh addresses and generate row addresses for refreshing memory cells included in a memory cell array.

In an embodiment, a semiconductor memory device includes: a temperature sensor configured to generate a high-temperature signal which is enabled at below set temperature; an address counter configured to count a smaller number of refresh addresses when the high-temperature signal is enabled than when the high-temperature signal is disabled; and a row decoder configured to decode the refresh addresses and generate row addresses for refreshing memory cells included in a memory cell array.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
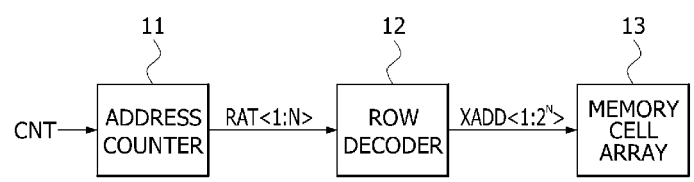
FIG. 1 is a block diagram illustrating the configuration of a known semiconductor memory device performing refresh.
Figure 2:
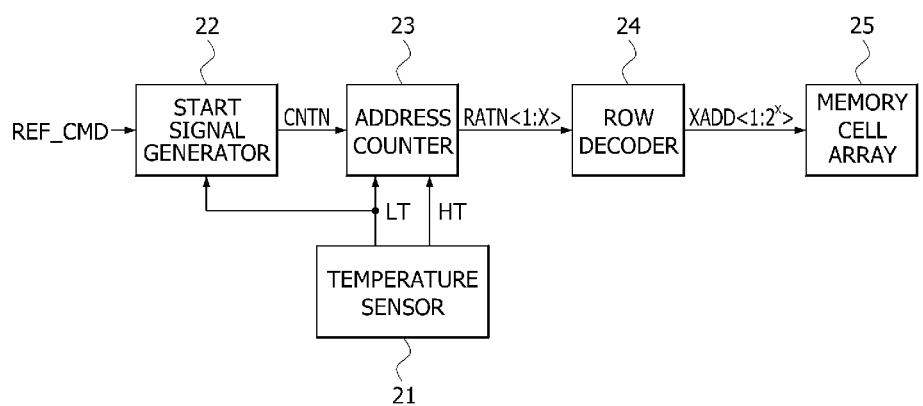
FIG. 2 is a block diagram illustrating the configuration of a semiconductor memory device performing refresh in accordance with an embodiment of the present invention.

FIG. 2 is a block diagram illustrating the configuration of a semiconductor memory device performing a refresh operation in accordance with an embodiment of the present invention.

Referring to FIG. 2, the semiconductor memory device in accordance with an embodiment of the present invention includes a temperature sensor 21, a start signal generator 22, an address counter 23, a row decoder 24, and a memory cell array 25.

The temperature sensor 21 is configured to generate a low-temperature signal LT which is enabled to a logic high level at below first set temperature and a high-temperature signal HT which is enabled to a logic low level at above second set temperature. The first set temperature may be set to be lower than the second set temperature. For example, the first set temperature may be set to 40° C., and the second set temperature may be set to 90° C. In this case, when the internal temperature of the semiconductor memory device is equal to or less than 40° C., the low-temperature signal LT is enabled to a logic high level. When the internal temperature is higher than 40° C. and lower than 90° C., the low-temperature signal LT and the high-temperature signal HT are disabled to a logic low level. When the internal temperature is higher than 90° C., the high-temperature signal HI is enabled to a logic high level.

The start signal generator 22 is configured to receive a refresh command REF_CMD and generate a start signal CNTN according to the low-temperature signal LT. More specifically, if the low-temperature signal LT is disabled to a logic low level, the start signal generator 22 generates a start signal CNTN when the refresh command REF_CMD is inputted. However, if the low-temperature signal LT is enabled to a logic high level, the start signal generator 22 generates a start signal CNTN when the refresh command REF_CMD is inputted at least two times. In this case, the pulse number of the start signal CNTN which is generated when the low-temperature LT is disabled is two times larger than when the low-temperature LT is enabled.

The address counter 23 is configured to count refresh addresses RATN<1:X>, according to an example, whenever a pulse of the start signal CNTN is inputted. The number X of refresh addresses RATN<1:X> counted by the address counter 23 may be set according to the low-temperature signal LT and the high-temperature signal HT. According to an example, when the low-temperature signal LT and the high-temperature signal HT are disabled to a logic low level, N memory cells corresponding to refresh addresses RATN<1:N> are activated to be refreshed at a refresh period. When the low-temperature signal LT is enabled to a logic high level, the address counter 23 outputs refresh addresses RATN<1:N+α>. When the high-temperature signal HT is enabled to a logic high level, the address counter 23 outputs refresh addresses RATN<1:N−α>.

The row decoder 24 is configured to decode the refresh addresses RATN<1:X> and generate row addresses XADD<1:$2^X$> for refreshing memory cells included in the memory cell array 25. As described above, the number X may be set according to the low-temperature signal LT and the high-temperature signal HT. That is, when the low-temperature signal LT is enabled to a logic high level, X becomes N+α, and when the high-temperature signal HT is enabled to a logic high level, X becomes N−α.

The refresh frequency of the above-described semiconductor memory device is controlled depending on the temperature. That is, when the internal temperature of the semiconductor memory device is lower than the first set temperature such that the low-temperature signal LT is enabled to a logic high level, the start signal generator 22 generates a start signal CNTN in case where the refresh command REF_CMD is inputted at least two times. Therefore, the counting number of the address counter 23 may be at most half of the counting number of the address counter 23 when both of the low-temperature signal LT and the high-temperature signal HT are disabled to a logic low level. Furthermore, when the low-temperature signal LT is enabled to a logic high level, the address counter 23 outputs refresh addresses RATN<1:N+α>, and thus reduces the number of memory cells which are simultaneously refreshed by $2^α$. However, when the internal temperature is higher than the second set temperature such that the high-temperature signal HT is enabled to a logic high level, the address counter 23 outputs refresh addresses RATN<1:N−α>, and thus increases the number of memory cells which are simultaneously refreshed by $2^α$. In short, the semiconductor memory device in accordance with an embodiment of the present invention reduces the refresh frequency at low temperature to reduce the current consumption, and increases the refresh frequency at high temperature to reduce a probability of a refresh fail.

Figure 3:
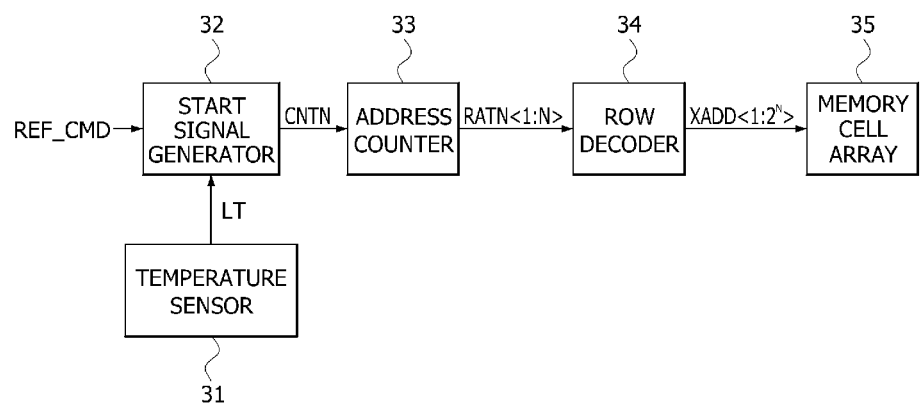
FIG. 3 is a block diagram illustrating the configuration of a semiconductor memory device performing refresh in accordance with an embodiment of the present invention.

FIG. 3 is a block diagram illustrating the configuration of a semiconductor memory device performing refresh in accordance with an embodiment of the present invention.

Referring to FIG. 3, the semiconductor memory device in accordance with an embodiment of the present invention includes a temperature sensor 31, a start signal generator 32, an address counter 33, a row decoder 34, and a memory cell array 35.

The temperature sensor 31 is configured to generate a low-temperature signal LT which is enabled to a logic high level at below set temperature. For example, the set temperature may be set to 40° C. In this case, when the internal temperature of the semiconductor memory device is equal to or less than 40° C., the low-temperature signal LT is enabled to a logic high level, and when the internal temperature is higher than 40° C., the low-temperature signal LT is disabled to a logic low level.

The start signal generator 32 is configured to receive a refresh command REF_CMD and generate a start signal CNTN according to the low-temperature signal LT. More specifically, if the low-temperature signal LT is disabled to a logic low level, the start signal generator 32 generates a start signal CNTN when the refresh command REF_CMD is inputted. However, if the low-temperature signal LT is enabled to a logic high level, the start signal generator 32 generates a start signal CNTN when the refresh command REF_CMD is inputted at least two times. In this case, the pulse number of the start signal CNTN which is generated when the low-temperature signal LT is disabled is two times larger than when the low-temperature signal LT is enabled.

The address counter 33 is configured to count refresh addresses RATN<1:N>, according to an example, whenever a pulse of the start signal CNTN is inputted.

The row decoder 34 is configured to decode the refresh addresses RATN<1:N> and generate row addresses XADD<1:$2^N$> for refreshing memory cells included in the memory cell array 35.

The refresh frequency of the above-described semiconductor memory device is controlled depending on the temperature. That is, when the internal temperature is lower than the set temperature such that the low-temperature signal LT is enabled to a logic high level, the start signal generator 32 generates the start signal CNTN in case where the refresh command REF_CMD is inputted at least two times. Therefore, the counting number of the address counter 33 may be at most half of the counting number of the address counter 33 when the low-temperature signal LT is disabled to a logic low level. In short, the semiconductor memory device in accordance with an embodiment of the present invention decreases the refresh frequency at low temperature to reduce the current consumption.

Figure 4:
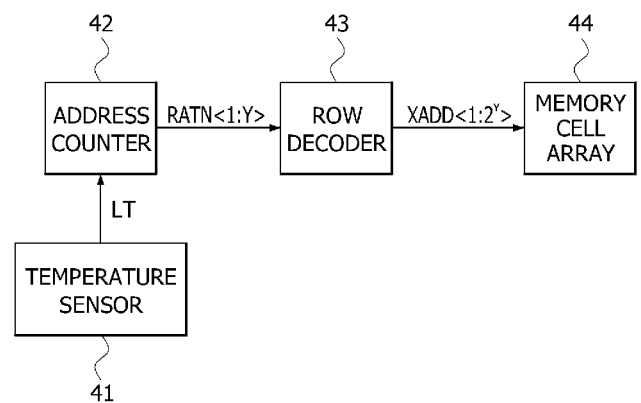
FIG. 4 is a block diagram illustrating the configuration of a semiconductor memory device performing refresh in accordance with an embodiment of the present invention.

FIG. 4 is a block diagram illustrating the configuration of a semiconductor memory device performing refresh in accordance with an embodiment of the present invention.

Referring to FIG. 4, the semiconductor memory device in accordance with an embodiment of the present invention includes a temperature sensor 41, an address counter 42, a row decoder 43, and a memory cell array 44.

The temperature sensor 41 is configured to generate a low-temperature signal LT which is enabled to a logic high level at below set temperature. For example, the set temperature may be set to 40° C. In this case, when internal temperature of the semiconductor memory device is equal to or less than 40° C., the low-temperature signal LT is enabled to a logic high level, and when the internal temperature is higher than 40° C., the low-temperature signal LT is disabled to a logic low level.

The address counter 42 is configured to count refresh addresses RATN<1:Y>. The number Y of refresh addresses RATN<1:Y> counted by the address counter 42 may be set according to the low-temperature signal LT. According to an example, when the low-temperature signal LT is disabled to a logic low level, the address counter 42 outputs refresh addresses RATN<1:N>, and when the low-temperature signal LT is enabled to a logic high level, the address counter 42 outputs refresh addresses RATN<1:N+α>.

The row decoder 43 is configured to decode the refresh addresses RATN<1:Y> and generate row addresses XADD<1:$2^Y$> for refreshing memory cells included in the memory cell array 44. As described above, the number Y is set by the low-temperature signal LT. That is, when the low-temperature signal LT is enabled to a logic high level, Y becomes N+α, and when the low-temperature signal LT is disabled to a logic low level, Y becomes N.

The refresh frequency of the above-described semiconductor memory device is controlled depending on the temperature. That is, when the internal temperature is lower than the set temperature such that the low-temperature signal LT is enabled to a logic high level, the address counter 42 outputs refresh addresses RATN<1:N+α> and thus reduces the number of memory cells which are simultaneously refreshed by $2^α$. In short, the semiconductor memory device in accordance with an embodiment of the present invention decreases the refresh frequency at low temperature to reduce the current consumption.

Meanwhile, an embodiment including the configuration characteristics of the semiconductor memory devices illustrated in FIGS. 3 and 4 may also be combined. That is, a semiconductor memory device may include the configuration characteristic of the start signal generator 32 of FIG. 3 and the configuration characteristic of the start signal generator 42 of FIG. 4.

Figure 5:
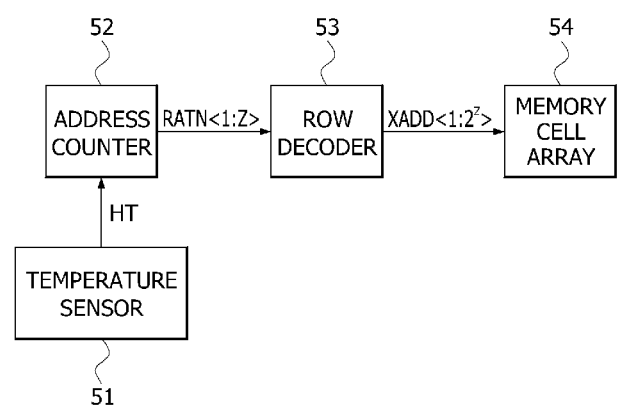
FIG. 5 is a block diagram illustrating the configuration of a semiconductor memory device performing refresh in accordance with an embodiment of the present invention.

FIG. 5 is a block diagram illustrating the configuration of the semiconductor memory device performing refresh in accordance with an embodiment of the present invention.

Referring to FIG. 5, the semiconductor memory device in accordance with an embodiment of the present invention includes a temperature sensor 51, an address counter 52, a row decoder 53, and a memory cell array 54.

The temperature sensor 51 is configured to generate a high-temperature signal HT which is enabled to a logic high level at above set temperature. For example, the set temperature may be set to 90° C. In this case, when the internal temperature of the semiconductor memory device is lower than 90° C., the high-temperature signal HT is disabled to a logic low level, and when the internal temperature is higher than 90° C., the high-temperature signal HT is enabled to a logic high level.

The address counter 52 is configured to count refresh addresses RATN<1:Z>. The number Z of refresh addresses RATN<1:Z> counted by the address counter 52 may be set according to the high-temperature signal HT. According to an example, when the high-temperature signal HT is disabled to a logic low level, the address counter 52 outputs refresh addresses RATN<1:N>, and when the high-temperature signal LT is enabled to a logic high level, the address counter 52 outputs refresh addresses RATN<1:N−α>.

The row decoder 53 is configured to decode the refresh addresses RATN<1:Z> and generate row addresses XADD<1:$2^Z$> for refreshing memory cells included in the memory cell array 54. As described above, the number Z may be set according to the high-temperature signal HT. That is, when the high-temperature signal HT is enabled to a logic high level, Z becomes N−α, and when the high-temperature signal HT is disabled to a logic low level, Z becomes N.

The refresh frequency of the above-described memory device is controlled depending on the temperature. That is, when the internal temperature is higher than the set temperature such that the high-temperature signal HT is enabled to a logic high level, the address counter 52 outputs refresh addresses RATN<1:N−α>, and increases the number of memory cells which are simultaneously refreshed by $2^α$ in comparison with when the high-temperature signal HT is disabled. In short, the semiconductor memory device in accordance with an embodiment of the present invention increases the refresh frequency at high temperature, thereby reducing a probability of a refresh fail.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a temperature sensor configured to generate a low-temperature signal which is enabled at below first set temperature and a high-temperature signal which is enabled at above second set temperature;

a start signal generator configured to receive a refresh command and generate a start signal according to the low-temperature signal; and an address counter configured to count refresh addresses in response to the start signal, wherein the address counter outputs a larger number of refresh addresses when the low-temperature signal is enabled than when the low-temperature and the high-temperature signal are disabled.

2. The semiconductor memory device of claim 1, wherein the first set temperature is set to be lower than the second set temperature.

3. The semiconductor memory device of claim 1, wherein, if the low-temperature signal is enabled, the start signal generator generates the start signal after at least two refresh commands are inputted.

4. The semiconductor memory device of claim 1, wherein the address counter counts a smaller number of refresh addresses when the high-temperature signal is enabled than when the low-temperature signal and the high-temperature signal are disabled.

5. The semiconductor memory device of claim 1, further comprising a row decoder configured to decode the refresh addresses and generate row addresses for refreshing memory cells included in a memory cell array.

* * * * *